United States Patent
Matsushita et al.

(10) Patent No.: US 7,271,658 B2
(45) Date of Patent: Sep. 18, 2007

(54) ELECTRIC COMPONENT FOR HIGH FREQUENCY POWER AMPLIFIER

(75) Inventors: Kouichi Matsushita, Yokohama (JP);
Kenichi Shimamoto, Komoro (JP);
Kazuhiro Koshio, Komoro (JP);
Kazuhiko Ishimoto, Komoro (JP);
Takayuki Tsutsui, Saku (JP)

(73) Assignees: Renesas Technology Corp., Tokyo (JP); Hitachi Hybrid Network, Co., Ltd., Yokohama-shi (JP)

( * ) Notice: Subject to any disclaimer, the term of this patent is extended or adjusted under 35 U.S.C. 154(b) by 114 days.

(21) Appl. No.: 11/149,265

(22) Filed: Jun. 10, 2005

(65) Prior Publication Data
US 2005/0280471 A1    Dec. 22, 2005

(30) Foreign Application Priority Data
Jun. 22, 2004    (JP)    ............................ 2004-183169

(51) Int. Cl.
*H03F 3/04*    (2006.01)
(52) U.S. Cl. ................... 330/289; 330/133; 330/285
(58) Field of Classification Search ............... None
See application file for complete search history.

(56) References Cited

U.S. PATENT DOCUMENTS 6,194,968 B1 * 2/2001 Winslow .................. 330/289
6,958,649 B2 * 10/2005 Nagamori et al. .......... 330/289

FOREIGN PATENT DOCUMENTS

JP    2000-151310    5/2000
JP    2004-007443    1/2004

* cited by examiner

*Primary Examiner*—Khanh Van Nguyen
(74) *Attorney, Agent, or Firm*—Mattingly, Stanger, Malur & Brundidge, P.C.

(57) ABSTRACT

An RF power module in which operating voltage is controlled by a control signal based on amplitude information includes a temperature detecting device which is provided over a semiconductor chip formed with an amplifying transistor or a semiconductor chip formed with a power source circuit; and a detector having a hysteresis characteristic which is provided over the semiconductor chip formed with the device or a different semiconductor chip, applies a bias to the temperature detecting device to compare the state of the device at two reference levels, outputs a signal indicating abnormality when judging that the temperature of the semiconductor chip formed with the temperature detecting device is above a predetermined temperature, and outputs a signal indicating normality when judging that the temperature of the semiconductor chip is below a second predetermined temperature lower than the predetermined temperature.

11 Claims, 7 Drawing Sheets

ELECTRIC COMPONENT FOR HIGH FREQUENCY POWER AMPLIFIER

CROSS-REFERENCE TO RELATED APPLICATION

The present application claims priority from Japanese patent application No. 2004-183169 filed on Jun. 22, 2004, the content of which is hereby incorporated by reference into this application.

BACKGROUND OF THE INVENTION

The present invention relates to a technique effective to be applied to an electric component which is used in a wireless communication system such as a cellular phone and incorporates a high frequency power amplifier amplifying and outputting a high frequency transmitting signal and a power source circuit supplying operating voltage. More specifically, the present invention relates to a technique effective to be applied to an electric component for high frequency power amplifier configuring a wireless communication system in which phase modulation and amplitude modulation of a transmitting signal are performed separately to carry out control for the amplitude modulation in a high frequency power amplifier.

In general, a high frequency power amplifier amplifying a modulated signal is incorporated into an output part on the transmitting side in wireless communication equipment (mobile communication equipment) such as a cellular phone. To control the gain of the high frequency power amplifier in accordance with a transmission level required from a baseband circuit or a control circuit such as a microprocessor, the high frequency power amplifier or an output power detector detecting the output level of an antenna is provided to control the gain of the power amplifier based on output level indicating signal Vramp and the detected output from the output power detector (see Patent document 1).

As one of the recent communication systems in cellular phones, there is a cellular phone of the GSM (Global System for Mobile communication) system modulating a transmitting signal by GMSK modulation. In addition to the GMSK (Gaussian Minimum Shift Keying) modulation mode, a cellular phone of the system called EDGE (Enhanced Data Rates for GMS Evolution) having the $3\pi/8$ rotating 8-PSK (Phase Shift Keying) modulation mode modulating the phase component and the amplitude component of a carrier wave and switching between the modes for performing communication is being put to practical use.

As a technique realizing the $3\pi/8$ rotating 8-PSK modulation (hereinafter, called 8PSK modulation) of the EDGE system, there are a method of performing phase modulation at the previous stage of a power amplifier and performing amplitude modulation in the power amplifier (polar loop method), and a method of performing phase modulation and amplitude modulation in the previous stage of a power amplifier (Pin control method). The invention related to the cellular phone of the polar loop system is described in Patent document 2.

[Patent document 1] Japanese Unexamined Patent Publication No. 2000-151310

[Patent document 2] Japanese Unexamined Patent Publication No. 2004-007443

SUMMARY OF THE INVENTION

In the field of cellular phones, a request to make electric components configuring a system smaller is high in order to reduce the body in size. An electric component for high frequency power amplifier (hereinafter, called an RF power module) incorporating a high frequency power amplifier amplifying and outputting a transmitting signal and a power source circuit supplying operating voltage is not exceptional. To achieve making the module smaller, it is important to miniaturize ICs (semiconductor integrated circuits) and components such as devices constituting the module and to reduce the space between the components. As the space between the components is reduced, the temperature in the module is higher due to heat generated by the components.

A power source IC having a relatively large amount of generated heat is mounted in an RF power module constituting a cellular phone of the polar loop system that the present inventors have attempted to develop. Heat generated in the power source IC is transmitted to an amplifying transistor chip constituting a high frequency power amplifier to increase the chip temperature. Apparently, the heat transmitted from the power source IC is added to heat generated by the last-stage amplifying transistor itself, whereby the chip temperature can exceed the value allowed for PN junction with the chip pitch initially decided from the desired module size.

As a technique preventing the chip temperature from being increased, it is considered that cooling fins are provided in the package of a module. The provision of such fins increases the size of the module, obstructing making a cellular phone equipped with the same smaller. Increase in the packaging density of the components in the module is meaningless.

An object of the present invention is to provide an electric component for a high frequency power amplifier (RF power module) which can output a signal indicating abnormality to the outside when the inner temperature is above a predetermined temperature and lower the temperature.

Another object of the present invention is to provide an electric component for a high frequency power amplifier (RF power module) which can immediately detect that the inner temperature is above a predetermined temperature and can detect temperature abnormality before a detector causes abnormality due to temperature rise, thereby indicating it to the outside.

The above and other objects and novel features of the present invention will be apparent from the description of this specification and the accompanying drawings.

The representative aspects of the invention disclosed in this application will be described as follows.

An electric component for high frequency power amplifier (RF power module) which incorporates a high frequency power amplifier as a semiconductor integrated circuit including an amplifying transistor and amplifying and outputting a transmitting signal and a power source circuit supplying operating voltage to the high frequency power amplifier in which the operating voltage of the high frequency power amplifier is controlled by a control signal based on amplitude information, the electric component includes: a temperature detecting device which is provided over a semiconductor chip formed with the amplifying transistor or a semiconductor chip formed with the power source circuit; and a temperature detector having hysteresis characteristic which is provided over the semiconductor chip formed with the temperature detecting device or a different semiconductor chip, applies a bias to the temperature detecting device to compare the state of the device at two reference levels, outputs a signal indicating abnormality to the outside when judging that the temperature of the semiconductor chip formed with the temperature detecting device is above a predetermined temperature, and outputs a signal indicating normality to the outside when judging that the temperature of the semiconductor chip is below a second predetermined temperature lower than the predetermined temperature.

According to the above-described means, the signal indicating abnormality is outputted to the outside when the temperature in the semiconductor chip having the largest amount of generated heat is above a predetermined temperature. The external controller can lower the temperature of the module. The signal indicating normality is outputted to the outside of the module when the temperature in the semiconductor chip is lower than a second predetermined temperature. The external controller can return the module to the normal operation.

The temperature detector has hysteresis characteristic. The signals indicating abnormality/normality cannot be outputted by mistake due to temperature fluctuation. Further, the temperature detector is formed over a semiconductor chip different from the semiconductor chip provided with the temperature detecting device, in case the temperature detecting device indicates an abnormal temperature, the temperature of the semiconductor chip of the temperature detector is lower than that. The temperature detector can be normally operated.

The RF power module preferable for applying the present invention configures a wireless communication system of the polar loop system in which phase modulation is performed in the previous stage of the high frequency power amplifier and amplitude modulation is performed in the high frequency power amplifier, whereby a control signal based on the amplitude information is a control signal for amplitude modulation. The present invention is applied to an RF power module incorporating a power source circuit supplying operating voltage to the high frequency power amplifier in which the output voltage of the power source circuit is controlled by the control signal based on the amplitude information to change the operating voltage of the high frequency power amplifier. A more desirable effect can be obtained.

Desirably, when the high frequency power amplifier has a construction in which plural amplifying transistors are connected in series, the temperature detecting device is provided over a semiconductor chip formed with the last-stage amplifying transistor. The largest electric current is flowed to the last-stage amplifying transistor. The chip is the first to reach an abnormal temperature. A signal indicating that the inner temperature in the module is above a predetermined temperature can be immediately outputted to the outside.

The temperature detector is formed over a semiconductor chip different from the semiconductor chip formed with the last-stage amplifying transistor and over the semiconductor chip formed with other amplifying transistors. This can reduce the number of components constituting the RF power module to make the module smaller. Also in this case, the power source circuit is desirably formed over a further different semiconductor chip. The power source circuit has the amount of generated heat which is next to or about the same as the last-stage amplifying transistor.

The effects obtained by the representative aspects of the invention disclosed in this application will be briefly described as follows.

According to the present invention, it is possible to realize an electric component for a high frequency power amplifier (RF power module) which can output a signal indicating abnormality to the outside when the inner temperature is above a predetermined temperature and lower the temperature.

Further, according to the present invention, it is possible to realize an electric component for a high frequency power amplifier (RF power module) which can immediately detect that the inner temperature is above a predetermined temperature and can detect temperature abnormality before a temperature detector causes abnormality due to temperature rise, thereby indicating it to the outside.

DETAILED DESCRIPTION OF THE INVENTION

A preferred embodiment of the present invention will be described below based on the drawings.

Figure 1:
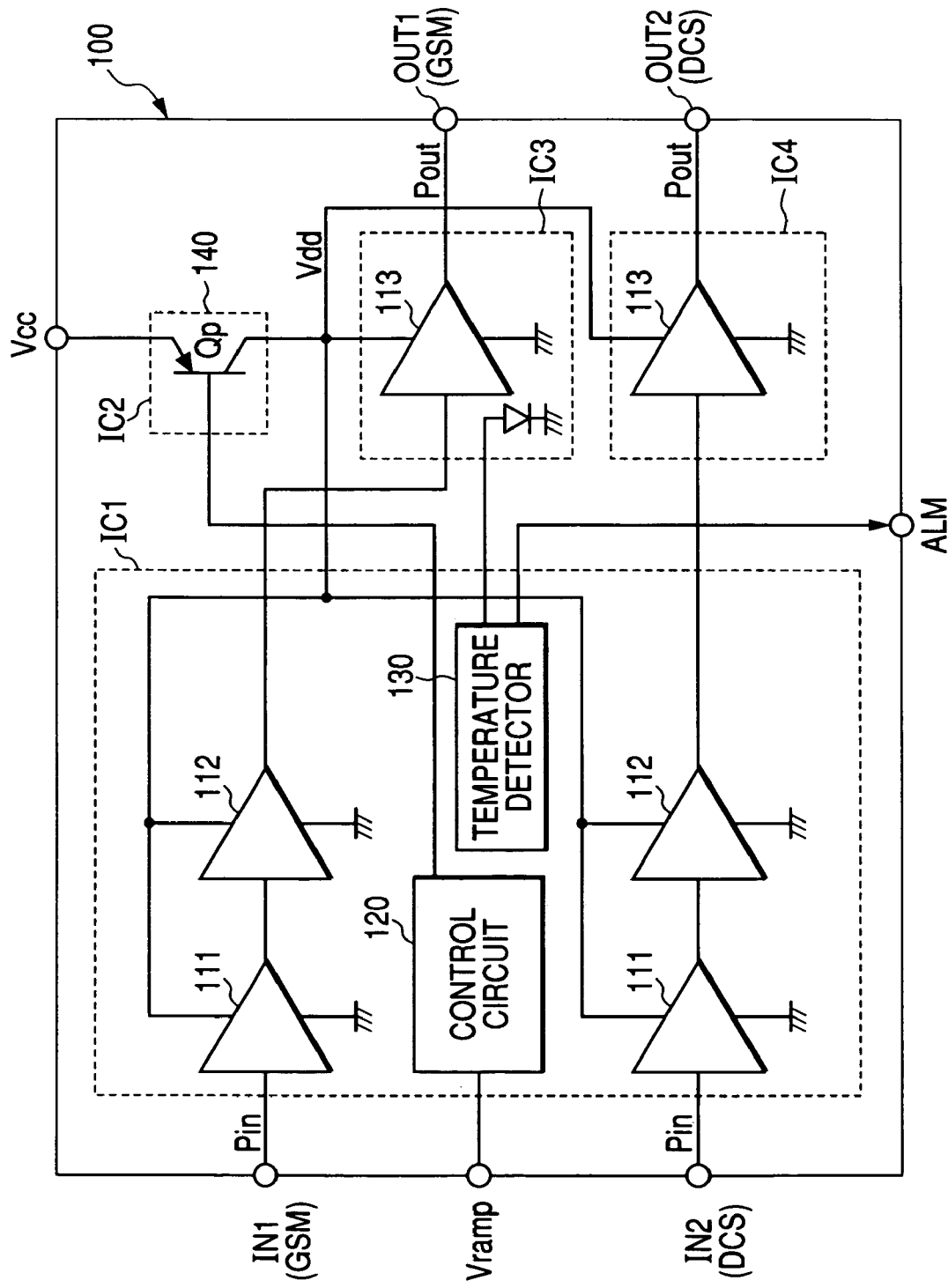
FIG. 1 is a block diagram showing an embodiment of an RF power module having a temperature detector according to the present invention.

FIG. 1 shows an embodiment of an RF power module having a temperature detector according to the present invention. In this specification, a module is handled as one electric component in such a manner that plural semiconductor chips and discrete components are mounted over an insulator substrate such as a ceramic substrate provided with printed wiring over its surface and inside so that the components are connected by the printed wiring or bonding wires to play a predetermined role.

Not being particularly limited, an RF power module 100 according to this embodiment is constructed as a module which can amplify a transmitting signal in the frequency bandwidth of two communication systems of GSM (Global System for Mobile Communication) and DCS (Digital Cellular System), that is, which can correspond to a dual band. In the GSM and DCS amplification systems, three amplification stages 111, 112, and 113 each including an amplifying transistor are connected in series. The RF power module 100 has a control circuit 120 controlling the gain (amplification factor) of the amplification stages 111, 112, and 113 based on output control signal Vramp provided from the outside, a temperature detector 130, and a power source circuit 140 for controlling operating voltage generating operating voltage Vdd of the amplification stages 111, 112, and 113.

The four amplification stages 111 and 112 on the previous-stage side of the three amplification stages 111, 112, and 113 of the two systems, the control circuit 120, and the temperature detector 130 are formed as semiconductor integrated circuit IC1 over one semiconductor chip such as a single crystal silicon. The power source circuit 140 is formed as semiconductor integrated circuit IC2 over a semiconductor chip different therefrom. The amplifying transistors constituting the last amplification stages 113 are formed as semiconductor integrated circuits IC3 and IC4 over different semiconductor chips, respectively.

Although not shown in FIG. 1, a capacitor device composed of a discrete component for shutting off the dc component of a high frequency transmitting signal amplified, a capacitor device for impedance matching, and an inductance device are connected as external components between input terminals IN1 and IN2 of transmitting signals in the RF power module 100 and the first amplification stages 111 and between the amplification stages. An impedance matching circuit using microstrip lines formed over the insulator substrate of the module is provided between the last amplification stages 113 and output terminals OUT1 and OUT2.

Figure 2:
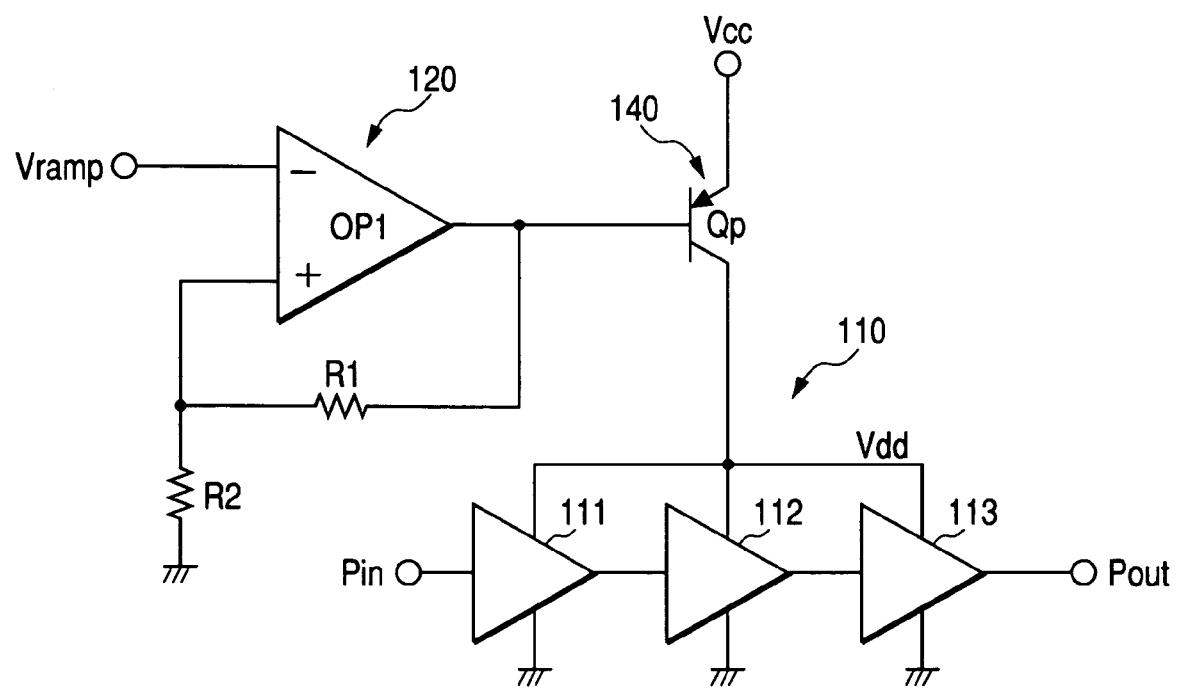
FIG. 2 is a block diagram showing the schematic construction of a control circuit and a power source circuit in the RF power module according to this embodiment.

FIG. 2 shows the schematic construction of the control circuit 120 and the power source circuit 140 in the RF power module 100 according to this embodiment.

According to this embodiment, the power source circuit 140 is composed of PNP bipolar transistor Qp which can flow a relatively large electric current. The control circuit 120 is composed of operational amp OP1 in which the output control signal (output level indicating signal) Vramp is inputted to its inverted input terminal and a voltage obtained by dividing an output voltage at the resistance ratio between resistances R1 and R2 is fed back to its non-inverted input terminal. The output of the operational amp OP1 controls the electric current flowed to the power source transistor Qp. The operating voltage Vdd supplied to the amplification stages 111, 112, and 113 of the high frequency power amplifier 110 is controlled in accordance with the output control signal Vramp.

Figure 3:
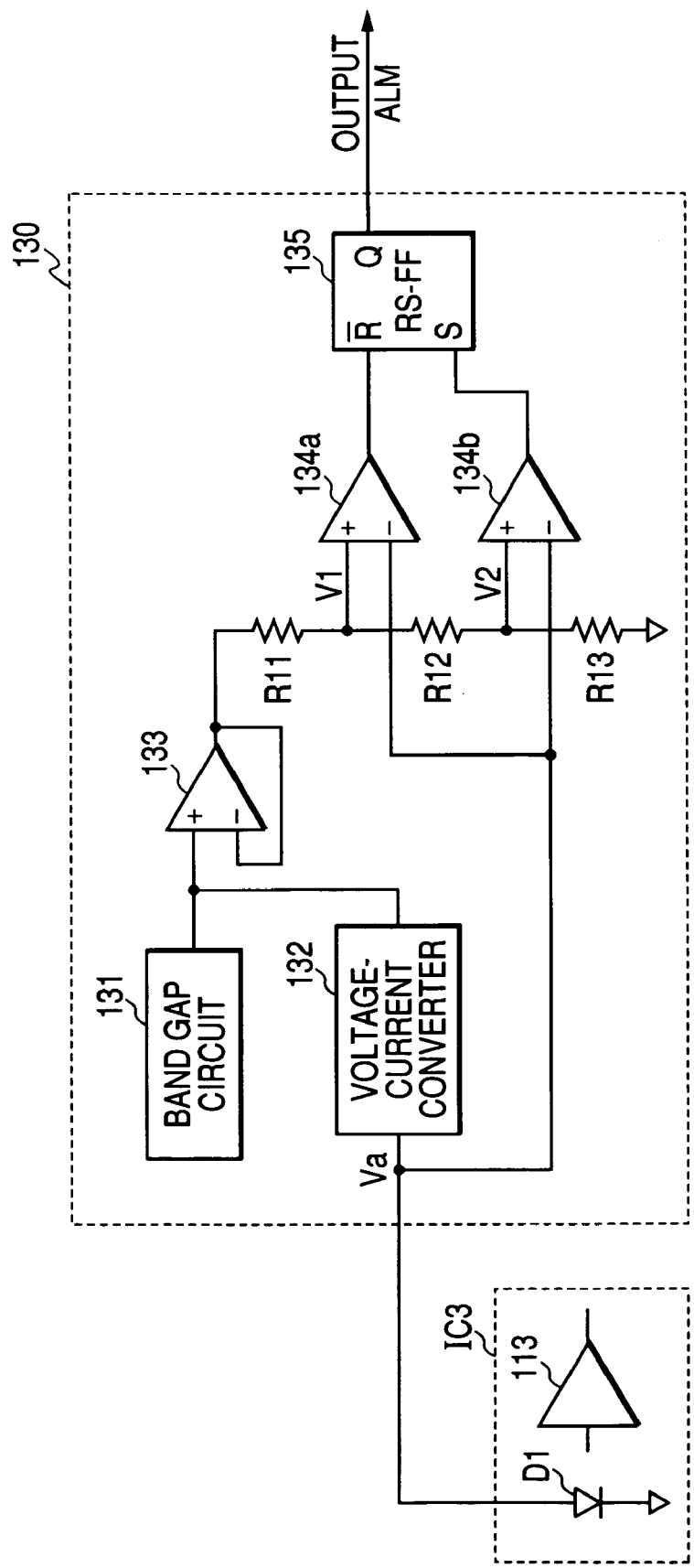
FIG. 3 is a block diagram showing a constructional example of the temperature detector in the RF power module according to this embodiment.

FIG. 3 shows a constructional example of the temperature detector 130 in the RF power module 100 according to this embodiment.

The temperature detector 130 shown in FIG. 3 has a constant voltage circuit 131 such as a band gap reference circuit generating reference voltage having low temperature dependence and source voltage dependence, a voltage-current converter 132 converting reference voltage Vref generated by the constant voltage circuit 131, a buffer amp 133 composed of a voltage follower impedance converting the reference voltage Vref generated by the constant voltage circuit 131, a set of comparators 134a and 134b receiving, as comparing voltages V1 and V2, a voltage obtained by dividing the output of the buffer amp 133 at the resistance ratio between resistances R11, R12, and R13 at their non-inverted input terminals, and an RS flip-flop 135 operated upon reception of the output of the comparator 134a at reset terminal/R and reception of the output of the comparator 134b at set terminal S.

According to this embodiment, diode D1 using PN junction is formed as a temperature detecting device over the semiconductor chip IC3 formed with the transistor of the last amplification stage 113 of the GSM amplification system. An electric current generated by the voltage-current converter 132 is flowed to the diode D1. Voltage Va on the anode side of the diode D1 is inputted to the inverted input terminals of the comparators 134a and 134b.

When the third-stage amplifying transistor is a MOS transistor, the diode D1 uses the PN junction of the PNP bipolar transistor parasitized between a P type region and an N type region and a P type or an N type substrate formed at the same time together with a diffusion layer as source and drain regions and a well region of the MOS transistor by the known MOS process.

When a signal inputted to the set terminal S is converted from the low level to the high level, the RS flip-flop 135 is operated to be brought to the set state, that is, output Q is changed to the high level. When a signal inputted to the reset terminal/R is converted from the high level to the low level, the RS flip-flop 135 is operated to be brought to the reset state, that is, the output Q is changed to the low level.

When a constant electric current (e.g., 100 μA) is flowed in the forward direction, the PN junction diode D1 indicates temperature characteristic having negative forward voltage Vf (−1.675 mV/deg). The temperature detector 130 according to this embodiment uses such temperature characteristic of the PN junction diode D1 to judge whether the chip temperature of the semiconductor chip IC3 formed with the transistor of the last amplification stage 113 is above a predetermined level or not. The cathode terminal of the diode D1 is connected to the grounding point. The anode terminal has a high voltage by the forward voltage Vf. This is inputted as the input voltage Va to the inverted input terminals of the comparators 134a and 134b.

There is set the resistance ratio between the resistances R11 to R13 which divides the reference voltage Vref to generate the V1 and V2 in such a manner that the forward voltage Vf (=Va) of the diode D1 at first predetermined temperature T1 (e.g., 130° C.) is matched with comparing voltage Vc2 and that the forward voltage Vf of the diode D1 at second predetermined temperature T2 higher than the first predetermined temperature (e.g., 140° C.) is matched with comparing voltage Vc1.

Figure 4A:
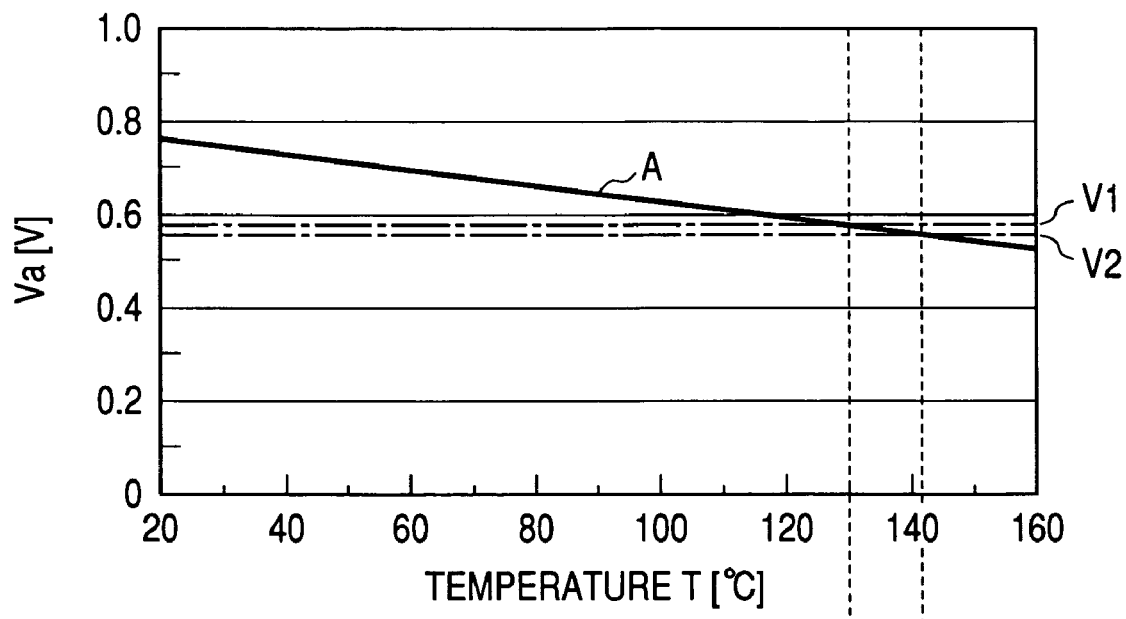
FIG. 4A is a graph showing the relation between temperature T and detecting voltage Va in the temperature detector according to the embodiment.

The operation of the temperature detector 130 according to this embodiment will be described using FIG. 4. In FIG. 4A, the change characteristic of the voltage Va on the anode side of the diode D1 to temperature is indicated by the solid line A. When the temperature of the semiconductor chip IC3 is lower than 130° C., the forward voltage Vf of the diode D1 is large and the voltage on the anode side, that is, the input voltage Va of the comparators 134a and 134b is sufficiently higher than the comparing voltages V1 and V2. The output Q of the flip-flop 135 is at the low level.

As the temperature of the semiconductor chip IC3 is higher, the voltage Va on the anode side of the diode D1 is lower. When the temperature of the semiconductor chip IC3 reaches about 130° C., the voltage Va is lower than the comparing voltage Vc1 of the comparator 134a so that the output of the comparator 134a is changed to the high level. The output of the comparator 134a is inputted to the reset terminal of the flip-flop 135. At his point, the output Q of the flip-flop 135 remains at the low level. When the temperature of the semiconductor chip IC3 reaches about 140° C., the voltage Va on the anode side of the diode D1 is lower than the comparing voltage Vc2 of the comparator 134b so that the output of the comparator 134b is changed to the high level.

The flip-flop 135 is brought to the set state so that the output Q is changed to the high level. According to this embodiment, the output Q of the flip-flop 135 is outputted as signal ALM indicating temperature abnormality to the outside of the module. A baseband circuit which has received the alarm signal ALM decreases the output control signal Vramp. The operating voltage Vdd supplied from the power source transistor Qp to the power amplifier is lowered. The amount of generated heat is reduced to lower the chip temperature.

As the temperature of the semiconductor chip IC3 is lower, the voltage Va on the anode side of the diode D1 is higher. When the temperature of the semiconductor chip IC3 reaches about 140° C., the voltage Va is higher than the comparing voltage V2 of the comparator 134b so that the output of the comparator 134b is changed to the low level. The output of the comparator 134b is inputted to the set terminal of the flip-flop 135. At this point, the output Q of the flip-flop 135 remains at the high level. When the temperature of the semiconductor chip IC3 is lowered to about 130° C., the voltage Va on the anode side of the diode D1 is lower than the comparing voltage V1 of the comparator 134a so that the output of the comparator 134a is changed to the low level.

Figure 4B:
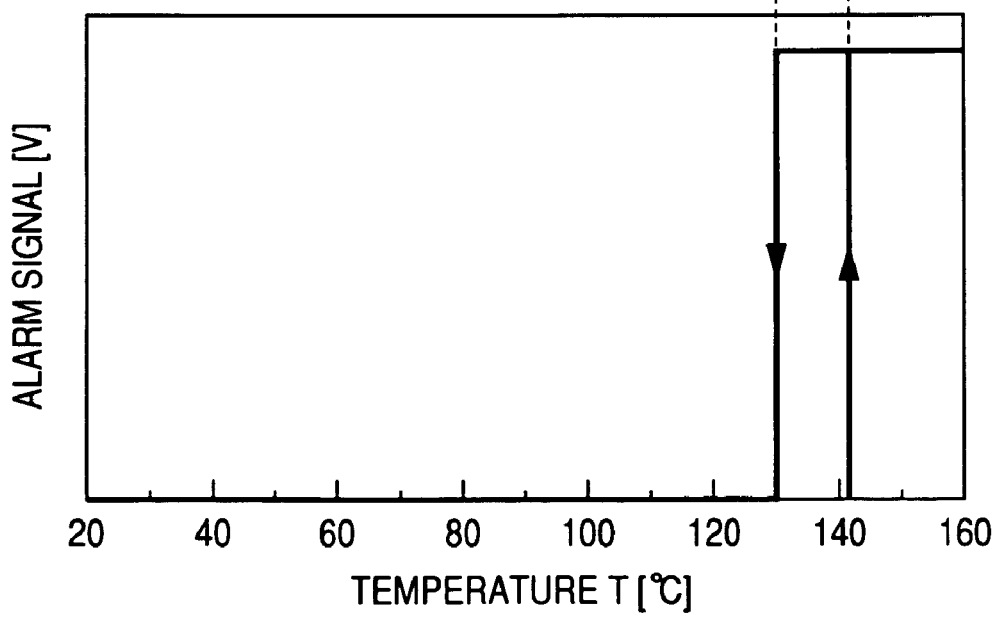
FIG. 4B is a graph showing the relation between an alarm signal outputted from the temperature detector according to the embodiment and the temperature T.

The flip-flop 135 is brought to the reset state so that the output Q is changed to the low level. The alarm signal ALM outputted to the outside of the module is at the low level. The baseband circuit which has received the alarm signal ALM increases the output control signal Vramp. The operating voltage Vdd supplied from the power source transistor Qp to the power amplifier is increased for returning the output power to a desired level. According to this embodiment, the temperature at which the flip-flop 135 is set is different from the temperature at which the flip-flop 135 is reset. As shown in FIG. 4B, the alarm signal ALM as the output of the detector has hysteresis characteristic. The wrong output of the alarm signal ALM due to temperature fluctuation can be avoided.

Figure 5:
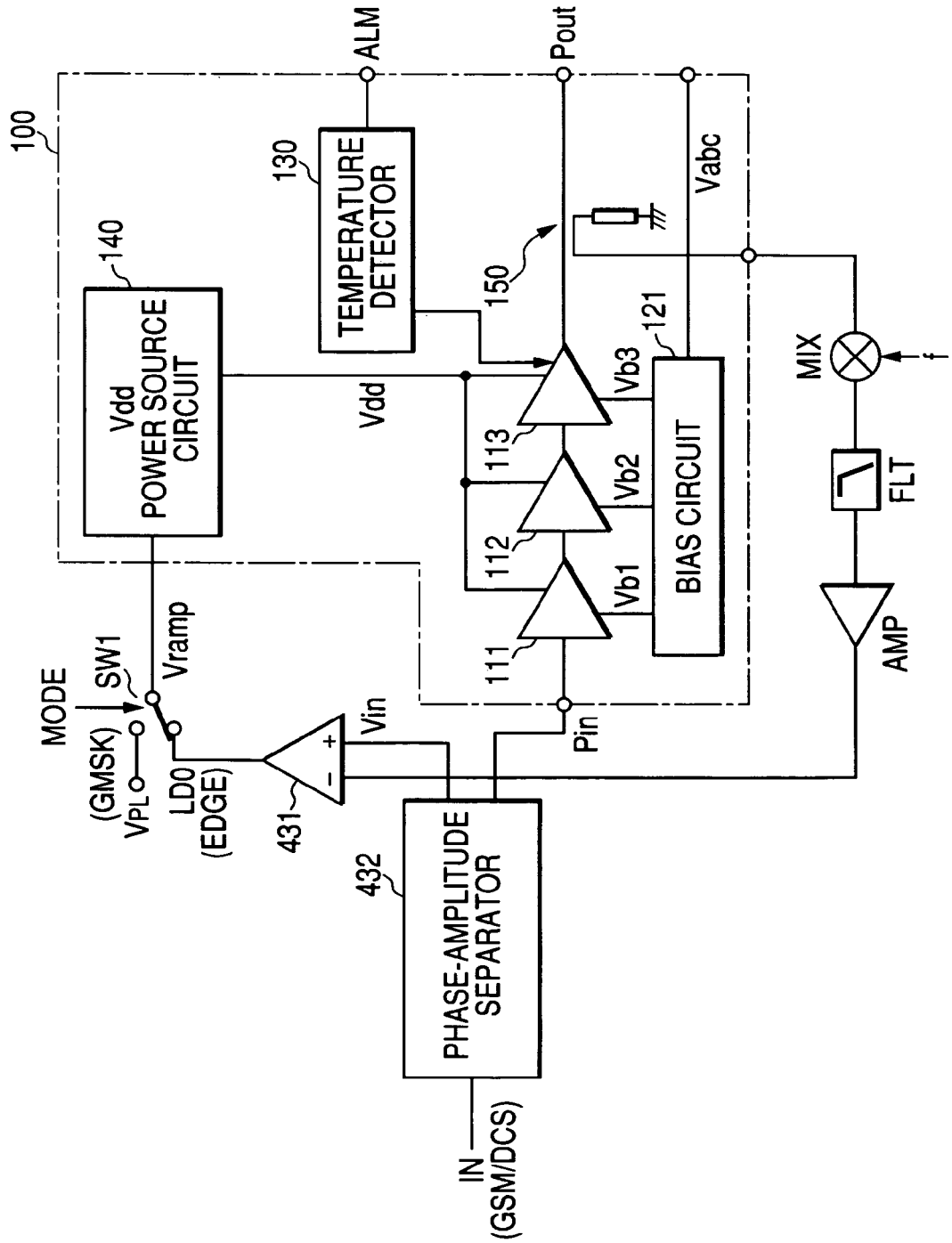
FIG. 5 is a block diagram showing a preferred constructional example when applying the RF power module having the temperature detector according to the present invention to a wireless communication system of the EDGE system.

FIG. 5 shows a preferred constructional example when applying the RF power module having the temperature detector according to the present invention to a wireless communication system having the EDGE mode performing the 8PSK modulation. The devices and circuits shown in FIG. 5 are indicated by the same reference numerals as those shown in FIG. 1 and the overlapped explanation is omitted. FIG. 5 shows one of the GSM signal amplification system and the CDS signal amplification system and the drawing of the other is omitted.

FIG. 5 shows a bias circuit 121 applying bias voltages Vb1, Vb2, Vb3 optimum for the three amplification stages 111, 112, and 113 constituting a high frequency power amplifier 110. In FIG. 1, these circuits are provided in the control circuit 120.

According to this embodiment, there is provided selector switch SW1 which selects output LD0 of an error amp 431 in the mode performing the 8PSK modulation (hereinafter, called EDGE mode) and output level indicating signal VPL provided from the baseband circuit in the mode performing the GMSK modulation (hereinafter, called GSM mode), thereby providing the selected one as the output control signal Vramp to the power source circuit 140. The selector switch SW1 is switch controlled by mode signal MODE provided from the baseband circuit. The switch SW1 may be provided in a modulator/demodulator (modulating/demodulating IC) having a function modulating a transmitting signal and demodulating a receiving signal. The baseband circuit generates the output level indicating signal VPL based on the output level decided in accordance with the distance between the module and the base station, that is, the strength of an electric wave.

The error amp 431 compares amplitude information signal Vin from a phase amplitude separator 432 separating the transmitting signal IN into phase information signal Pin and the amplitude information signal Vin with detecting signal Vdt from a coupler 150 for output level detection provided on the output side of the high frequency power amplifier 110 to output a signal in accordance with the potential difference. This carries out feedback control so that the output level of the high frequency power amplifier 110 is matched with the level of the amplitude information signal Vin.

The output of the coupler 150 is frequency converted (down-converted) by mixer MIX to be provided as the detecting signal Vdt via filter FLT and amp AMP to the error amplifier 431. The coupler 150 can be mounted over the substrate of the RF power module 100 or can be constructed of microstrip lines formed over the substrate. The phase amplitude separator 432 is provided in the modulating/demodulating IC having a function modulating a transmitting signal and demodulating a receiving signal.

Figure 6:
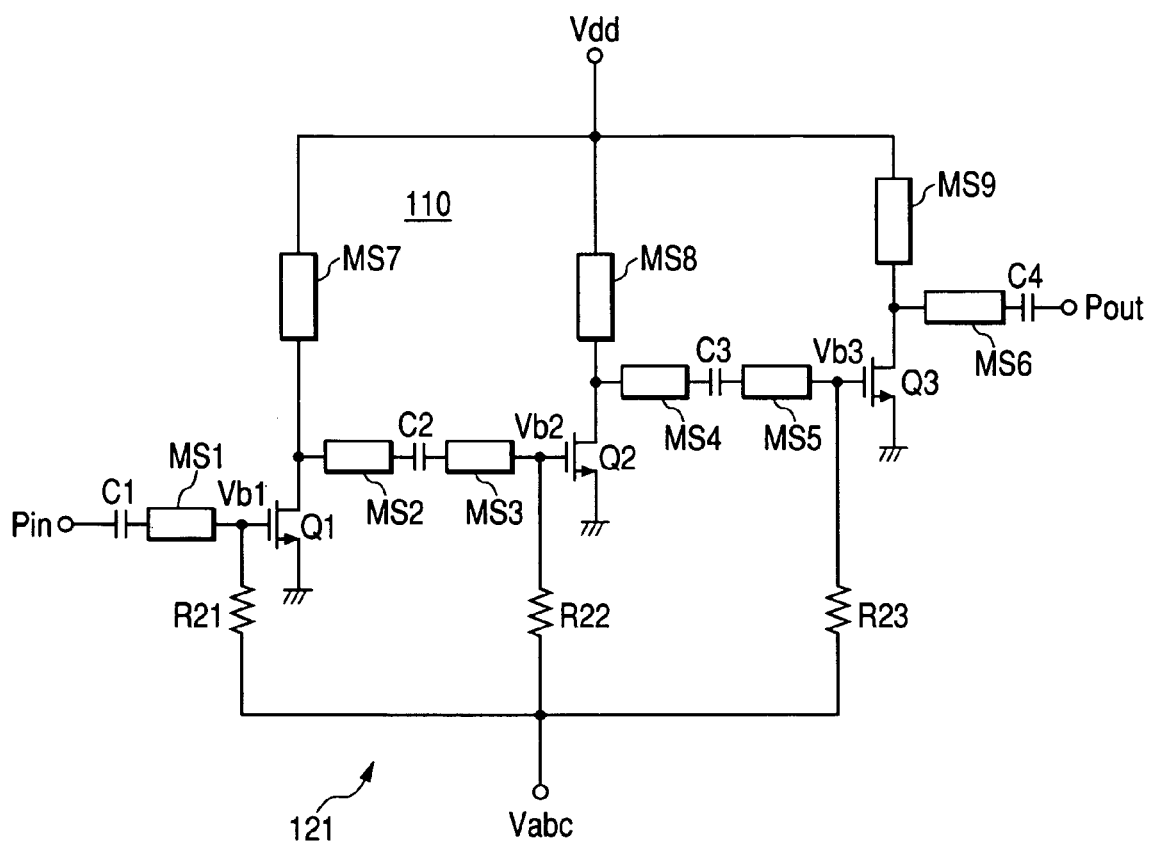
FIG. 6 is a circuit diagram showing a specific circuit constructional example of a high frequency power amplifier of the RF power module according to the embodiment.

FIG. 6 shows a specific circuit constructional example of the high frequency power amplifier 110. The high frequency power amplifier 110 according to this embodiment has multiple stages in which plural field-effect transistors are connected in series as amplifying devices. The high frequency power amplifier 110 has three stages in which the drain terminal of first-stage amplifying transistor Q1 is connected to the gate terminal of middle-stage amplifying transistor Q2 and the drain terminal of the middle-stage transistor Q2 is connected to the gate terminal of last-stage amplifying transistor Q3.

In the high frequency power amplifier 110 of FIG. 6, the high frequency signal Pin is inputted via capacitor device C1 to the gate terminal of the first-stage amplifying transistor Q1 and the drain terminal of the last-stage amplifying transistor Q3 is connected via capacitor device Q4 to output terminal Pout. The dc component of the high frequency input signal Pin is cut to amplify the ac component for output. The output level is controlled by the bias circuit 121 and the operating voltage Vdd of the power source circuit 140. The operating voltage Vdd is applied via microstrip lines MS7 to MS9 to the drain terminals of the power amplifying transistors Q1, Q2, and Q3 included in the amplification stages 111, 112, and 113.

The bias circuit 121 has resistances R21, R22, and R23. Vbias provided from the baseband circuit is supplied via the resistances R21, R22, and R23 to the gates of the amplifying transistors Q1, Q2, and Q3 and is then applied as the bias voltages Vb1, Vb2, and Vb3. The bias circuit 121 may be constructed of a resistance type potential divider so as to generate and apply the optimum gate bias voltages Vb1, Vb2, and Vb3 different from each other. Alternatively, to cancel Vth fluctuation of the amplifying transistors, the Vbias may be voltage-current converted for converting it to a voltage by the MOS diode to be the Vb1, Vb2, and Vb3.

In FIG. 6, the reference numerals MS1 to MS6 denote microstrip lines serving as inductance devices for impedance matching between the stages. The reference numerals MS7 to MS9 denote microstrip lines for impedance matching to the power source circuit 140. The capacitors C1, C2, C3, and C4 connected in series with the microstrip lines MS1 to MS6 shut off a dc voltage.

Figure 7:
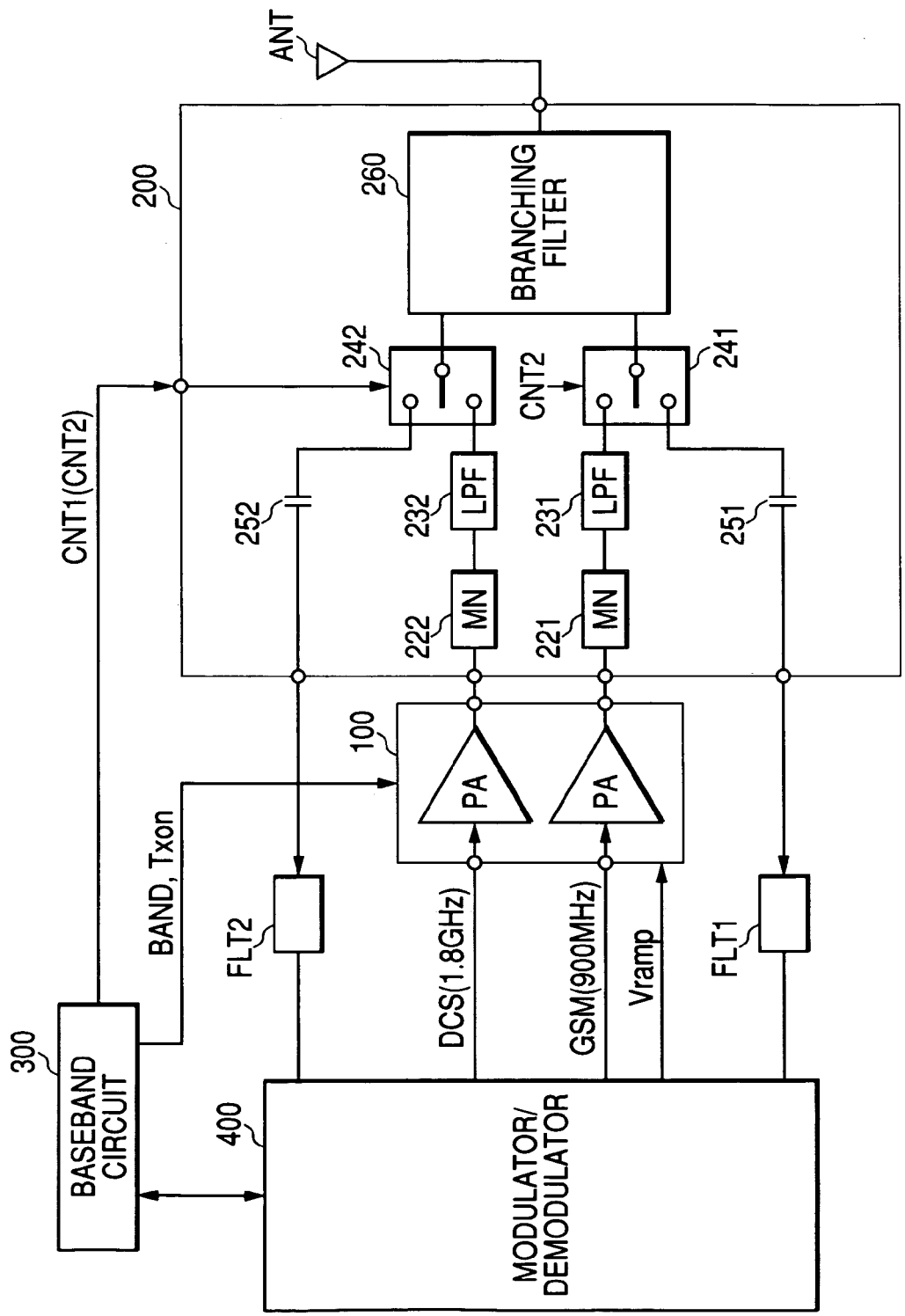
FIG. 7 shows a constructional example of the entire cellular phone system of a dual band system of GSM and DCS using the RF power module according to the embodiment.

FIG. 7 shows a constructional example of the entire cellular phone system of the dual band system of GSM and DCS permitting transmission and reception in the EDGE mode using the RF power module according to the embodiment.

In FIG. 7, the reference letter ANT denotes an antenna for signal electric wave transmission and reception; the numeral 100 denotes the RF power module of the embodiment; the numeral 200 denotes a front-end module; the numeral 300 denotes a baseband circuit (baseband LSI) generating I and Q signals based on transmitted data (baseband signal) and generating the bias voltage Vbias and band switch signal BAND to the power amplifier 110 in the RF power module 100 to control the RF power module 100; the numeral 400 denotes a modulator/demodulator modulating and up-converting the transmitting signals (I and Q signals) and down-converting and demodulating a receiving signal to generate the I and Q signals; and the reference letters FLT1 and FLT2, filters removing any noise and jammer from the receiving signal.

The filter FLT1 is a filter of a GSM signal in a 900 MHz bandwidth. The filter FLT2 is a filter of a DCS signal in a 1.8 GHz bandwidth. The baseband circuit 300 can be constructed of plural LSIs and ICs such as a DSP (Digital Signal Processor), a microprocessor, and semiconductor memory.

The front-end module 200 has impedance matching circuits 221 and 222 connected to the transmission output terminal of the RF power module 100 for performing impedance matching, low-pass filters 231 and 232 attenuating harmonic, switch circuits 241 and 242 for switching between transmission and reception, capacitances 251 and 252 cutting the dc component from a receiving signal, and a branching filter 260 branching a GSM signal from a DCS signal. These circuits and devices are mounted as a module over one ceramic substrate. Switch signals CNT1 and CNT2 of the switch circuits 241 and 242 for switching between transmission and reception are provided from the baseband circuit 300.

The modulator/demodulator 400 has a cross modulator (mixer) modulating the transmitting signals (I and Q signals), a phase detector and an amplitude detector separating the phase component and the amplitude component from a modulated signal, a transmitting oscillator up-converting a transmitting signal, a mixer down-converting and demodulating a receiving signal, and a variable gain amplifier amplifying a demodulated signal to a signal having a predetermined amplitude.

The invention which has been made by the present inventors is specifically described above based on the embodiment. The present invention is not limited to the embodiments and various modifications can be made in the scope without departing from the purpose. According to the embodiment, the diode is used as the temperature detecting device. Any device such as a resistance device having temperature dependence may be used. Desirably, a device which can be formed in a semiconductor chip and has significant temperature dependence may be used.

According to the embodiment, the diode as the temperature detecting device is formed over the semiconductor chip IC3 formed with the transistor of the last amplification stage 113 of the GSM amplification system. Depending on the arrangement of the chips and the spacing in the module, the temperature of the semiconductor chip IC2 formed with the power source transistor Qp can be higher. The temperature detecting device may be formed over the semiconductor chip IC2 formed with the power source transistor Qp. The temperature detecting devices may be formed over both the semiconductor chip IC3 formed with the transistor of the last amplification stage 113 of the GSM amplification system and the semiconductor chip IC4 formed with the transistor of the last amplification stage 113 of the DCS amplification system.

The temperatures at which the temperature detector 130 is operated are not limited to 140° C. and 130° C. and may be decided in accordance with the characteristic of an IC used. The temperature difference of hysteresis of the temperature detector 130 is not limited to 10° C. and may be 15 or 20° C.

According to the embodiment, the three amplifying transistors are connected to constitute the power amplifier 110. Two or four amplifying transistors may be used. According to the embodiment, the last-stage outputting transistor Q3 is formed over a semiconductor chip different from the semiconductor chip formed with the amplifying transistors Q1 and Q2. The Q3 may be formed over the chip formed with the Q1 and Q2. According to the embodiment, the control circuit 120 and the temperature detector 130 are formed over the chip formed with the amplifying transistors Q1 and Q2. They may be formed over a chip different from the chip formed with the Q1 and Q2.

There is mainly described above the case that the invention which has been made by the present inventors is applied to the power module configuring a wireless communication system permitting transmission and reception by the EDGE system having the 8PSK modulation mode as the background utilization field. The present invention is not limited thereto and can be used for an RF power module configuring a wireless communication system such as a cellular phone and a mobile phone of a communication system such as CDMA (Code Division Multiple Access) controlling the operating voltage of the high frequency power amplifier to control the amplitude of a transmitting signal.

The invention claimed is:

1. An electric component for a high frequency power amplifier which incorporates a high frequency power amplifier as a semiconductor integrated circuit including an amplifying transistor for amplifying and outputting a transmitting signal, a power source circuit supplying operating voltage to the high frequency power amplifier in which the operating voltage produced by the power source circuit can be controlled by a control signal based on amplitude information, the electric component comprising:

a temperature detecting device which is provided over a semiconductor chip formed with the amplifying transistor; and
  a temperature detector which is provided over the semiconductor chip formed with the temperature detecting device or a different semiconductor chip,
  wherein temperature detecting device outputs a first signal in accordance with the semiconductor chip, and
  wherein the temperature detector receives the first signal, compares the first signal with two different comparison levels based on the state of the temperature detecting device, determines whether the temperature of the semiconductor chip formed with the temperature detecting device is above a predetermined temperature or not, outputs a signal indicating abnormality above a first comparison level, and outputs a signal indicating normality below a second comparison level corresponding to a temperature lower than the temperature corresponding to the first comparison level.

2. The electric component for a high frequency power amplifier according to claim 1, wherein the high frequency power amplifier has a plurality of amplifying transistors coupled in series, last-stage of the amplifying transistor being formed over a semiconductor chip different from a semiconductor chip formed with other amplifying transistors, and wherein the temperature detecting device is formed over the semiconductor chip formed with last-stage of the amplifying transistor, and the temperature detector is formed over a semiconductor chip different from the semiconductor chip formed with last-stage of the amplifying transistor.

3. The electric component for a high frequency power amplifier according to claim 2, wherein the temperature detector is formed over the semiconductor chip formed with the amplifying transistors in the previous stage of the last-stage amplifying transistor.

4. The electric component for a high frequency power amplifier according to claim 2, wherein the power source circuit is formed over a third semiconductor chip different from the semiconductor chip formed with the last-stage amplifying transistor and the semiconductor chip formed with the amplifying transistors in the previous stage of the last-stage amplifying transistor.

5. An electric component for a high frequency power amplifier which incorporates a high frequency power amplifier as a semiconductor integrated circuit including an amplifying transistor for amplifying and outputting a transmitting signal, the electric component comprising:
   a temperature detecting device which is provided over a semiconductor chip formed with the amplifying transistor; and
   a temperature detector which is provided over the semiconductor chip formed with the temperature detecting device or a different semiconductor chip,
   wherein temperature detecting device outputs a first signal in accordance with the semiconductor chip, and
   wherein the temperature detector receives the first signal, compares the first signal with two different comparison levels based on the state of the temperature detecting device, determines whether the temperature of the semiconductor chip formed with the temperature detecting device is above a predetermined temperature or not, outputs a signal indicating abnormality above a first comparison level, and outputs a signal indicating normality below a second comparison level corresponding to a temperature lower than the temperature corresponding to the first comparison level.

6. The electric component for a high frequency power amplifier according to claim 5, wherein the high frequency power amplifier has a plurality of amplifying transistors coupled in series, last-stage of the amplifying transistor being formed over a semiconductor chip different from a semiconductor chip formed with other amplifying transistors, and wherein the temperature detecting device is formed over the semiconductor chip formed with last-stage of the amplifying transistor, and the temperature detector is formed over a semiconductor chip different from the semiconductor chip formed with last-stage of the amplifying transistor.

7. The electric component for a high frequency power amplifier according to claim 6, wherein the temperature detector is formed over the semiconductor chip formed with the amplifying transistors in the previous stage of the last-stage amplifying transistor.

8. An electric component for a high frequency power amplifier which incorporates a high frequency power amplifier as a semiconductor integrated circuit including an amplifying transistor for amplifying and outputting a transmitting signal and a power source circuit supplying operating voltage to the high frequency power amplifier in which the operating voltage produced by the power source circuit can be controlled by a control signal based on amplitude information, the electric component comprising:
   a temperature detecting device which is provided over a semiconductor chip formed with the amplifying transistor; and
   a temperature detector which is provided over the semiconductor chip formed with the power source circuit or a different semiconductor chip, determines, at two different comparison levels based on the state of the temperature detecting device, whether the temperature of the semiconductor chip formed with the temperature detecting device is above a predetermined temperature or not, outputs a signal indicating abnormality above a first comparison level, and outputs a signal indicating normality below a second comparison level corresponding to a temperature lower than the temperature corresponding to the first comparison level.

9. The electric component for a high frequency power amplifier according to claim 8, wherein the high frequency power amplifier has plural amplifying transistors connected in series, the last-stage amplifying transistor being formed over a semiconductor chip different from a semiconductor chip formed with other amplifying transistors, and the power source circuit and the temperature detecting device are formed over a semiconductor chip different from the semiconductor chip formed with the last-stage amplifying transistor.

10. The electric component for a high frequency power amplifier according to claim 9, wherein the temperature detector is formed over the semiconductor chip formed with the amplifying transistors in the previous stage of the last-stage amplifying transistor.

11. The electric component for a high frequency power amplifier according to claim 10, wherein the power source circuit is formed over a third semiconductor chip different from the semiconductor chip formed with the last-stage amplifying transistor and the semiconductor chip formed with the amplifying transistors in the previous stage of the last-stage amplifying transistor.

* * * * *